United States Patent [19]

Antipov

[11] 4,155,778
[45] May 22, 1979

[54] FORMING SEMICONDUCTOR DEVICES HAVING ION IMPLANTED AND DIFFUSED REGIONS

[75] Inventor: Igor Antipov, Pleasant Valley, N.Y.

[73] Assignee: International Business Machines Corporation, Armonk, N.Y.

[21] Appl. No.: 865,813

[22] Filed: Dec. 30, 1977

[51] Int. Cl.² .................. H01L 21/265; H01L 7/54
[52] U.S. Cl. .................... 148/1.5; 148/187; 357/34; 357/43; 357/50; 357/91
[58] Field of Search .............. 357/57, 34, 43, 50, 357/91; 148/1.5, 187

[56] References Cited

U.S. PATENT DOCUMENTS

| | | | |
|---|---|---|---|
| 3,892,596 | 7/1975 | Bjorklund et al. | 148/1.5 |
| 3,925,105 | 12/1975 | Sloan, Jr. | 148/1.5 |
| 4,021,270 | 5/1977 | Hunt et al. | 148/1.5 |
| 4,025,364 | 5/1977 | Smith | 148/1.5 |
| 4,044,371 | 8/1977 | Abdelrahman et al. | 357/28 |
| 4,045,250 | 8/1977 | Dingwall | 148/1.5 |
| 4,053,915 | 10/1977 | Cave | 357/22 |
| 4,082,571 | 4/1978 | Graul et al. | 148/1.5 |

OTHER PUBLICATIONS

Runge et al., "... Ion Implanted ... Layers in Si" Appl. Phys. 10 (1976) 181.
Collins, "Effecting a High Collector Doping ..." IMB-TDB, 10 (1967) 497.
Dearnaley et al., "Ion Implantation" North Holland, Amsterdam, 1973 pp. 454-456.

*Primary Examiner*—L. Dewayne Rutledge
*Assistant Examiner*—Upendra Roy
*Attorney, Agent, or Firm*—Thomas F. Galvin

[57] ABSTRACT

A method for making ion implanted resistors in conjunction with transistors and other devices within an integrated circuit semiconductor substrate. The implantation of the resistors is done after a predeposition diffusion of the base region of the transistors but prior to the base drive-in step. The subsequent emitter thermal diffusion, or annealing step in the case of ion implanted emitters, consitutes the annealing step for the ion implanted resistor regions.

9 Claims, 8 Drawing Figures

FORMING SEMICONDUCTOR DEVICES HAVING ION IMPLANTED AND DIFFUSED REGIONS

BACKGROUND OF THE INVENTION

1. Field of the Invention

This invention relates to methods for fabricating semiconductor integrated circuit structures utilizing both diffusion as well as ion implantation. In particular, it relates to the formation of ion implanted resistor regions during the fabrication of other devices within the chip, such as transistros having diffused base regions.

2. Description of the Prior Art

The method of forming semiconductor devices utilizing ion implantation has received a great deal of attention in recent years as a potential substitute for standard diffusion processes. The primary advantage of ion implantation as compared to diffusion is said to be the greater control of the area of the active region to be formed within the semiconductor, as well as the doping level. Thus, while diffusion technology has been satisfactory for the formation of impurity regions within the semiconductor substrate, it is thought that ion implantation will be required for more advanced devices. However, diffusion technology is well established and continues to be used.

It has been demonstrated that ion implantation is better than diffusion in the formation of resistor regions within the substrate particularly resistors with high resistivity. Such high valued resistors require low concentration levels, and it is difficult to obtain this with diffusion. Controlling the resistance value of resistors using thermal diffusion is difficult, as the spread of values using selected diffusion parameters is often greater than can be accepted for modern semiconductor circuits. These problems are substantially lessened if resistors are made by ion implantation.

However, even with the use of ion implantation for forming all of the impurity regions within a semiconductor substrate, a thermal cycle, commonly termed annealing, is required. For example, the process for forming the emitter region of a transistor with ion implantation is best accomplished by performing what is termed a predeposition ion implantation step followed by an annealing cycle of at least 1000° C. for one hour to rearrange the impurities within the emitter region. It has been recognized that this thermal cycle could cause problems with the resistor regions if they were formed prior to or simultaneously with the formation of the emitter. Thus, it has been the standard practice within the industry to form the resistor region after the formation of all other regions which require thermal cycling for their formation. However, this arrangement requires in general more processing steps due to the need for a greater number of masks. In addition, because the maximum concentration of the implanted ions of the resistor are not at the surface there are problems with regard to the stability of the resistors.

In the last few years, those skilled in the art have contemplated using the annealing or diffusion step of the emitter regions to also effect the annealing of previously implanted resistor regions. See, for example, U.S. Pat. No. 3,933,528 issued in the name of B. J. Sloan, Jr. However, these efforts have been confined to simultaneous or successive implantations of the various regions, e.g., the base and resistor regions. It would be desirable to utilize this type of technique in cases where the base or other regions are diffused, rather than ion implanted. In particular, it is desirable that such a process require a minimum number of masks to form the various impurity regions.

SUMMARY OF THE INVENTION

It is therefore an object of my invention to simplify the fabrication of ion implanted resistors formed within integrated circuit structures in which diffusion is used to form other impurity regions.

It is another object of my invention to improve the reliability of such ion implanted resistors.

These and other objects of my invention are achieved by ion implanting resistor regions prior to the formation of the emitter region of said transistor. The implantation is preferably done directly into the semiconductor substrate at relatively low energy levels. The resistor is formed after the diffusion of the base region of the bipolar transistor but prior to the base drive-in step. In the preferred process, the base diffusion step also forms contacts for the resistor.

DESCRIPTION OF THE PREFERRED EMBODIMENTS

FIGS. 1A-1F inclusive, there are shown the successive steps in the novel method of making an integrated circuit resistor in accordance with my invention.

Figure 1A:
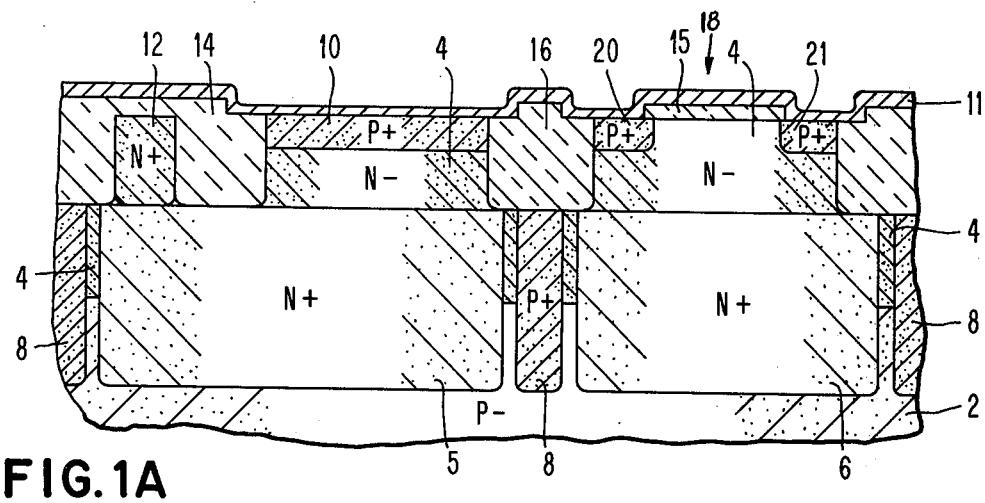
FIGS. 1A-1F are sectional view showing the preferred process for making the present invention.

FIG. 1A illustrates a partially-completed integrated circuit which includes an epitaxial layer 4 of N− conductivitiy type which has been deposited atop P− substrate 2. Subcollector regions 5 and 6 have outdiffused into epitaxial layer 4 and P+ regions 8 have outdiffused to function as isolation regions. Region 6 functions as an isolation region for the P type resistor to be formed. Preferably, layer 4 has a thickness of around 2 microns or less and a concentration of from 2.1 to $2.3 \times 10^{16}$ atoms/cm$^3$.

Base 10 of the transistor is initially formed in layer 4 by the predeposition of BBr$_3$ atop the substrate. Typically, the predeposition is accomplished in a dry oxygen and argon atmosphere for around one hour to form a 400 Å layer of borosilicate glass (BSG) 11.

A subcollector reach-through region 12 has been formed which contacts subcollector region 5. Reach-through region 12 is isolated from the P+ base region 10 by means of an oxide isolation region 14. On the opposite side of base region 10, oxide isolation region 16 separates the active transistor region from region 18 in which is to be formed a resistor. In the present case the resistor is to be of P type conductivity although the principles of my invention are also applicable to N type resistors formed, for example, from arsenic or phosphorus. In that case, the region underneath the N type resistor would be P type and preferably formed simultaneously with isolation regions 8. In addition, it will be evident to those of skill in the art that the conductivity types of various regions previously described and to be described could be reversed and still remain within the scope of my invention. Moreover, not all of the regions illustrated in the drawing are necessary for an operative embodiment. They are illustrated as representing the best mode of practicing my invention. For example, the recessed oxide isolation regions could be replaced by impurity isolation regions.

Returning to FIG. 1A, P+ regions 20 and 21 are contact areas for the resistor to be fabricated im the case of P type resistors. These regions are formed in the same steps as are used to form P+ region 10.

Figure 1B:
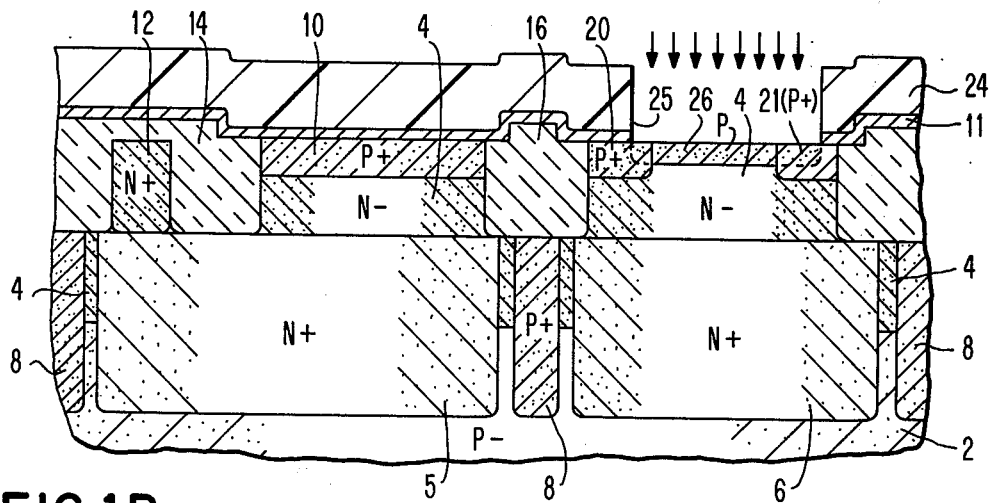
Figure 1C:
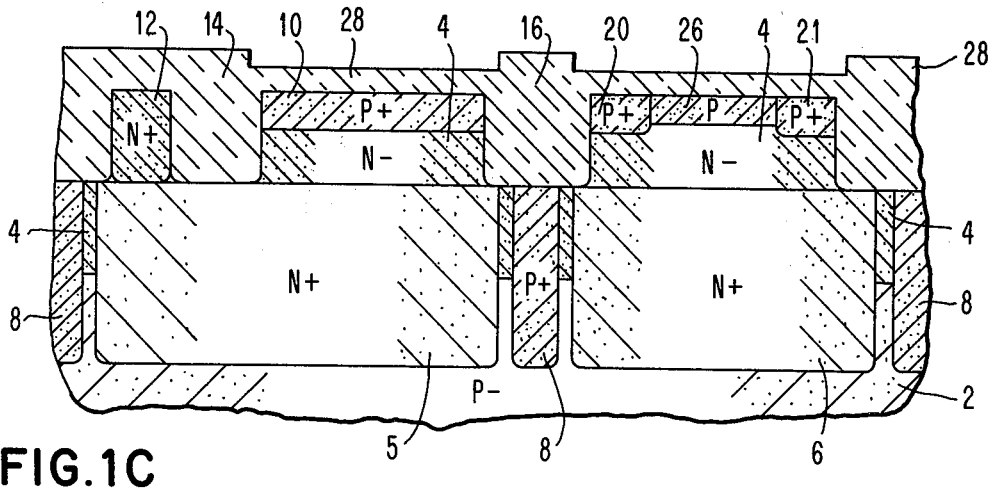

As shown in FIG. 1B, a photoresist blocking layer 24 is deposited atop the substrate and exposed and developed to open window 25 for the formation of P type resistor region 26. Oxide layer 15 and BSG layer 11 are then etched away over region 18 while mask 24 protects the remainder of the substrate. In the preferred embodiment, the implant species is boron 11 which is implanted at an energy of 70 Kev to a dosage of around $2.2 \times 10^{+13}$ ions/cm$^2$. These values of energy and dosage yield a resistor value of around 2000 ohms per square at the completion of the entire process. Although the implantation is shown as being done directly into layer 4, the use of a "screen" oxide of around 300 Å thickness is also a practical technique.

The dosage selected is that required for the resistor having the highest resistance value. The steps of forming resist masks, exposing selected regions and then ion implanting may be repeated at various selected resistor sites if lower valued resistors are also to be formed. N type resistors could also be formed instead of, or in addition to, P type resistors at this stage.

Following the implantation of resistor 26, photoresist layer 24 and BSG layer 11 are stripped. The substrate is then oxidized so as to form a relatively thick oxide layer 28 over the substrate, which is the base drive-in step. This combined base drive-in and reoxidation process is preferably performed in an atmosphere of dry oxygen and steam at 925° C. for around one and one-half hours to form an oxide layer which is around 800 Å thick. Different thicknesses are also practical.

No resist mask is required at this point. The drive-in causes the depth of regions 10, 20 and 21 to increase slightly.

A layer of silicon nitride 30 is then deposited by standard chemical vapor deposition techniques. Nitride layer 30 is formed by conventional techniques, typically using a composition of silane, nitrogen and ammonia gas vapors at a temperature of around 1000° C. to form a layer which is 1600 Å thick or less.

Figure 1D:
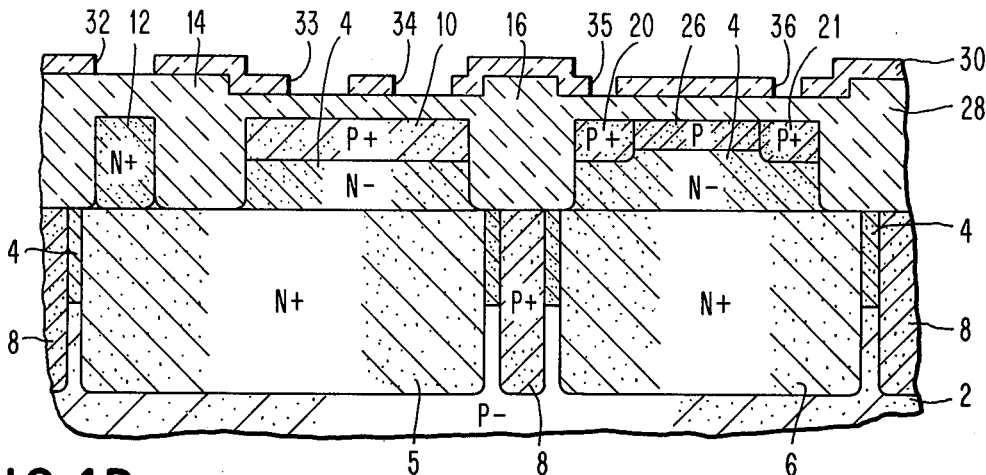

Openings 32, 33, 34, 35 and 36 are formed in nitride layer 30 by conventional lithographic and wet or dry etching techniques as shown in FIG. 1D. The resist mask used for etching the openings is not shown. In the case of wet etching, a layer of silicon dioxide may be deposited atop the silicon nitride to protect it against the resist etchant. Nitride layer 30 thereby comprises an "all-contacts" mask, with openings defining all contact and subsequent impurity regions to be formed within the substrate, as is well-known to those of skill in the art.

Figure 1E:
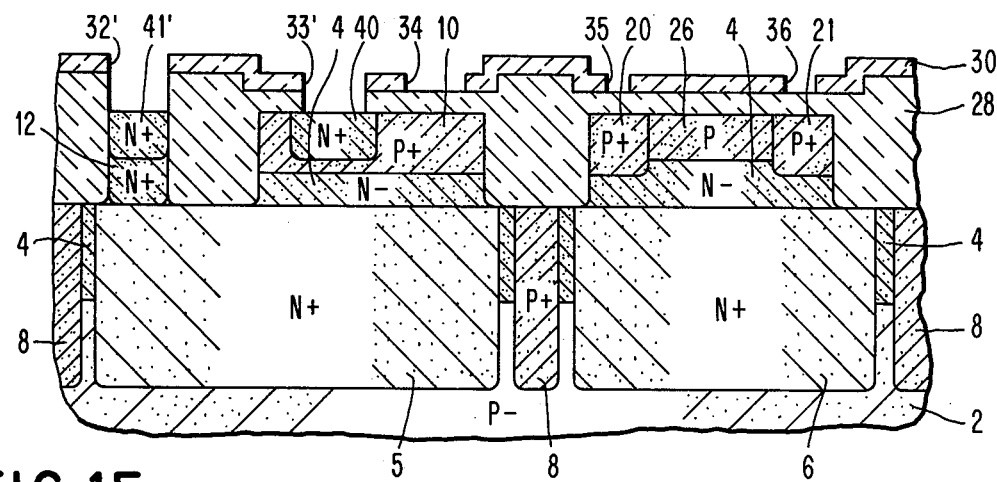

Turning to FIG. 1E, openings 32' and 33' are made in oxide layer 28 by blocking off the remainder of the substrate with a photoresist mask (not shown). This serves to expose the substrate over subcollector reach-through region 12 and that portion of base region 10 in which the emitter of the transistor is to be formed. Emitter 40 is then formed in base 10 by the diffusion of arsenic, preferably from an arsenic capsule source as taught in Ghosh et al, U.S. Pat. No. 4,049,478, which is assigned to the same assignee as the present application. Concurrently, the doping level of subcollector reach-through region 12 is raised by the diffusion of the same dopant to form a high conductivity region 41. The diffusion of emitter 40 is accomplished in a standard diffusion furnace which is held to a temperature of around 1000° C. for approximately 145 minutes. Alternatively, the emitter could be formed by ion implantation followed by annealing at around the same temperature for 100 minutes. The emitter diffusion process or the annealing step which follows implantation constitutes the annealing step for resistor 26.

Figure 1F:
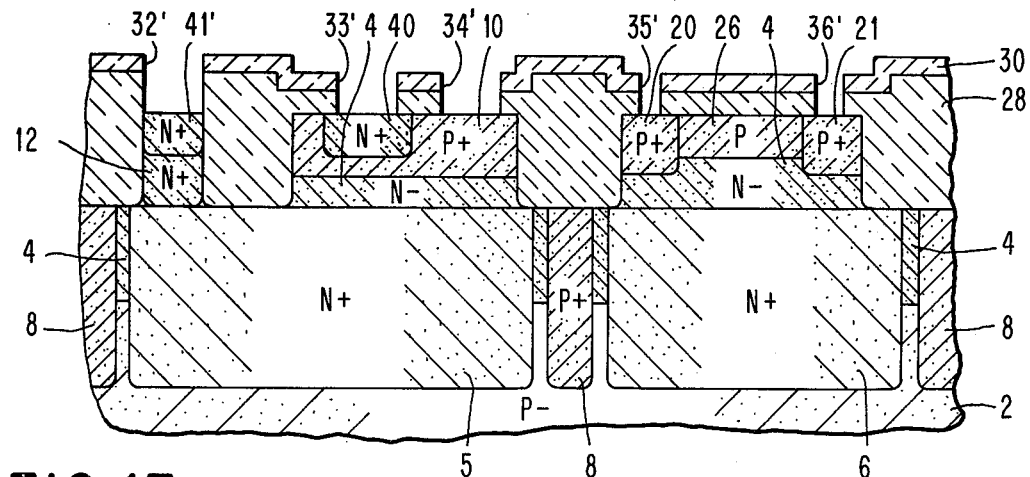

The basic process is completed by protecting regions 40 and 41 with a resist mask (not shown) and etching away oxide layer 28 from those regions defined by openings 34, 35 and 36 to form openings 34', 35' and 36'. The resist is then stripped and all of the regions which are to have contact metallization deposited thereon are now exposed as shown in FIG. 1F. Metallization (not shown) is then formed by conventional evaporation or sputtering techniques typically; the metallization would comprise platinum and copper-doped aluminum or platinum, chrome and copper-doped aluminum, etc. This step is not shown since it is well-known to those of ordinary skill in the art and forms no part of my invention per se.

Figure 2:
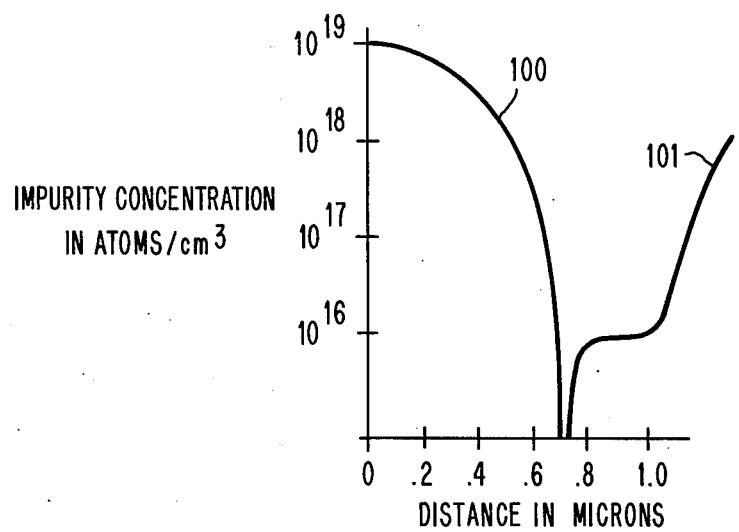
FIGS. 2 and 3 illustate the impurity profiles of the base and resistor regions fabricated in accordance with my invention.
Figure 3:
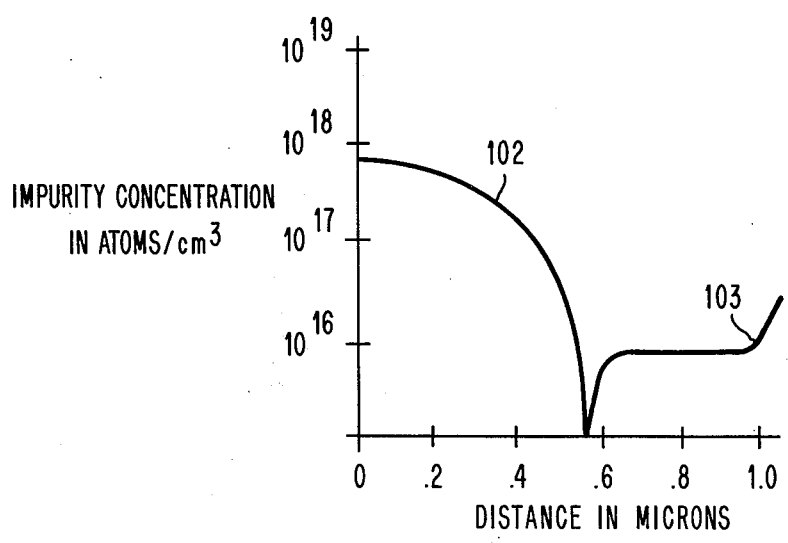

FIGS. 2 and 3 illustrate the net impurity profiles in epitaxial layer 4 of base region 10 and implant region 26, respectively, as obtained by the process described above. Having been formed using the same steps as for the base region, resistor contact regions 20 and 21 have the same profile as the base. The curves denoted by the numerals 100 and 102 represent the profile of the P type impurity of base region 10 and resistor region 26 respectively. The curves denoted by the numerals 101 and 103 represent the profile of the N+ subcollector regions 5 and 6, respectively.

The significant point in the graphs is the overall similarity of the profiles. The profile of the resistor very much resembles the profile of the base region, thereby assuring that the resistor is highly reliable. The highest concentration of impurities of resistor 26 is at the surface. Thus, the resistive is less susceptible to inversion due to charges in the overlying insulation or potentials in overlying conductive steps.

While the invention has been particularly shown and described with reference to preferred embodiments thereof, it will be understood by those skilled in the art that the foregoing and other changes in form and detail may be made without departing from the spirit and scope of the invention. For example, with N type resistors, the resistor contact regions would be formed during the emitter diffusion.

I claim:

1. A method of fabricating an integrated circuit semiconductor device, which includes a semiconductor layer of a first conductivity type in which active devices and resistors are to be formed, comprising the steps of:

forming a first masking means over said semiconductor layer, said first masking means having a first predetermined pattern of openings;

introducing impurities of a second conductivity type into selected regions of said layer by a predeposition diffusion step to form at least first active device regions, said first masking means protecting the remainder of said layer;

forming a second masking means over said first masking means, said second masking means having another predetermined pattern of openings;

removing at least a portion of said first masking means exposed by said other openings;

implanting ions of a selected conductivity type through said other openings into other selected regions of said layer at a relatively low energy level to form resistor regions, said second masking means protecting the remainder of said layer to prevent ion implantation therethrough;

removing said second masking means;

oxidizing said layer at high temperature in an oxygen atmosphere, thereby driving-in said predeposited impurities to form first active device regions;

introducing impurities of a first conductivity type into a selected area of each of said first active device regions so as to form second active device regions;

said impurities of said first conductivity type being introduced by a process which includes diffusion at high temperature so as to cause an annealing of said implanted ions in said resistor.

2. A method as in claim 1 wherein said impurities of said first conductivity type are introduced by ion implantation.

3. A method as in claim 1 wherein said impurities of said first conductivity type are introduced by capsule diffusion.

4. A method as in claim 1 wherein said resistor ions are of said second conductivity type and contact regions for said resistors are formed during the formation of said first active device regions.

5. A method as in claim 1 wherein said predeposition diffusion comprises the steps of:

depositing $BBr_3$ atop said layer in an oxygen atmosphere for a sufficient time and temperature to cause boron atoms to enter said first active device regions; and removing the residue of said $BBr_3$ deposition from the surface of said layer prior to said oxidizing step.

6. A method as in claim 5 wherein said resistor ions are of the same conductivity type as boron and contacts for said resistor are formed during the formation of said first active device regions.

7. A method as in claim 6 wherein said first and second active device regions are base and emitter regions, respectively.

8. A method as in claim 1 further comprising the steps of performing a second ion implantation step after said ion implantation step into a set of said other selected regions so as to form resistors having different resistive values.

9. A method as in claim 1 wherein said resistor ions are of said first conductivity type and contact regions for said resistors are formed during the formation of said second active device regions.

* * * * *